(12) United States Patent
Kojima

(10) Patent No.: US 8,294,175 B2
(45) Date of Patent: Oct. 23, 2012

(54) LIGHT-EMITTING DEVICE AND DISPLAY

(75) Inventor: Kensuke Kojima, Kanagawa (JP)

(73) Assignee: Sony Corporation, Tokyo (JP)

( * ) Notice: Subject to any disclaimer, the term of this patent is extended or adjusted under 35 U.S.C. 154(b) by 105 days.

(21) Appl. No.: 12/985,079

(22) Filed: Jan. 5, 2011

(65) Prior Publication Data

US 2011/0175860 A1    Jul. 21, 2011

(30) Foreign Application Priority Data

Jan. 15, 2010   (JP) .............................. P2010-007362

(51) Int. Cl.
*H01L 33/00*   (2010.01)

(52) U.S. Cl. ......................................... 257/99; 345/204

(58) Field of Classification Search .................... 257/99; 345/204

See application file for complete search history.

(56) References Cited

U.S. PATENT DOCUMENTS

2002/0064032 A1   5/2002  Oohata
2004/0259282 A1   12/2004  Oohata

FOREIGN PATENT DOCUMENTS

| JP | 2002-118124 | 4/2002 |
|---|---|---|
| JP | 2002-182580 | 6/2002 |
| JP | 2003-168762 | 6/2003 |

*Primary Examiner* — Bradley K Smith
*Assistant Examiner* — Mohammad T Karimy
(74) *Attorney, Agent, or Firm* — K&L Gates LLP

(57) ABSTRACT

A light-emitting device includes: a semiconductor layer including a first conductive contact layer, a first conductive cladding layer, an active layer, a second conductive cladding layer, a second conductive contact layer and a resin block layer in this order; a first electrode in contact with the first conductive contact layer; and a second electrode in contact with the second conductive contact layer. The second conductive contact layer includes a first opening at least in a region facing the first electrode. Moreover, the resin block layer includes a plurality of second openings communicated with the first opening, and the first opening has an air gap.

6 Claims, 8 Drawing Sheets

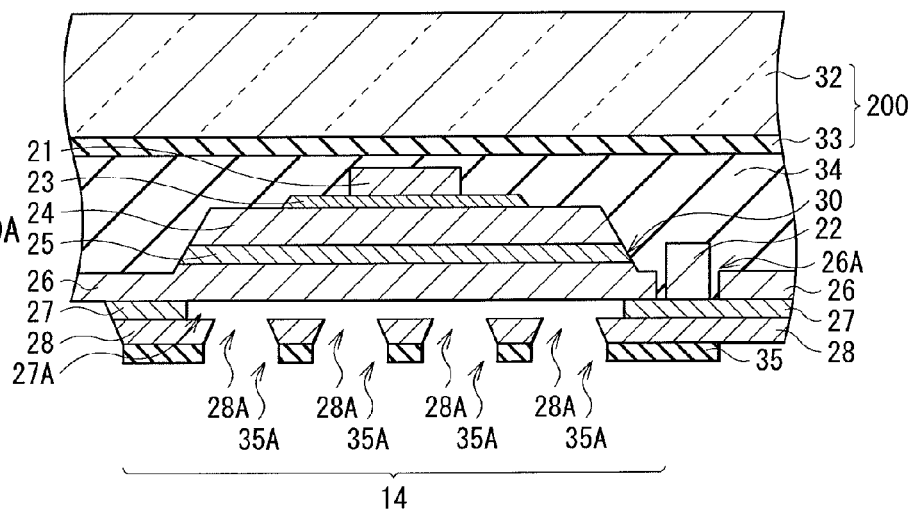
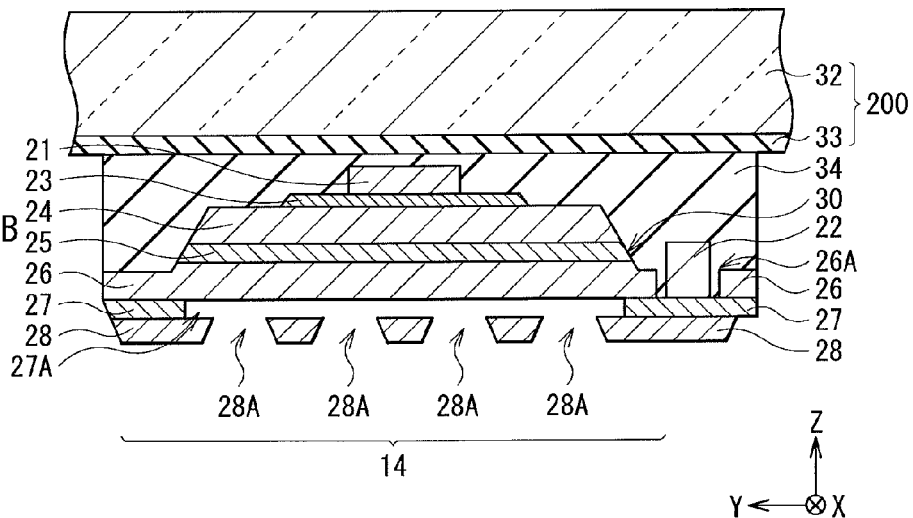

LIGHT-EMITTING DEVICE AND DISPLAY

CROSS REFERENCES TO RELATED APPLICATIONS

The present application claims priority to Japanese Patent Application JP 2010-007362 filed on Jan. 15, 2010, the entire contents of which is hereby incorporated by reference.

BACKGROUND

The present disclosure relates to a light-emitting device that does not include an electrode on a light emission surface and a display including the light-emitting device in each pixel.

In recent years, LEDs (Light Emitting Diodes) have been used in various devices such as backlights of liquid crystal displays, display panels of LED displays and lighting fixtures. Accordingly, cost reduction in LEDs is strongly desired. To reduce the cost of the LEDs, for example, an improvement in productivity, selection of low-cost materials and the like are necessary.

For example, to improve productivity, typically, a chip size is reduced to produce a large number of LEDs from one wafer. In recent years, the chip size is extremely small, for example, 20 μm, and it is difficult to handle a single LED chip. Therefore, it is not realistic to mount each LED chip on a circuit board with use of a mounter.

Therefore, as described in Japanese Unexamined Patent Application Publication No. 2002-182580, for example, instead of mounting with use of the mounter, enlarged transfer which will be described below has been performed. First, a supporting wafer including an adhesive layer on a surface thereof is prepared. Next, the surface where the adhesive layer is provided of the supporting wafer is brought into contact with a surface on an LED side of a wafer formed by forming a plurality of LEDs in a matrix on a substrate, and then LEDs are separated from the wafer at predetermined intervals by laser lift-off to transfer the LEDs to the supporting wafer. Accordingly, the arrangement pitch of the LEDs is sparse. Next, a circuit board (a glass substrate) in which connection electrodes are formed with a pitch equal to the sparse arrangement pitch of the LEDs is prepared, and the LEDs adhered to the supporting wafer are transferred to the circuit board. Thus, a mounting board formed by mounting the LEDs on the circuit board is allowed to be formed.

SUMMARY

In addition to cost reduction, lower power consumption and higher power of LEDs are strongly desired. To reduce power consumption of LEDs or increase the power of LEDs, it is necessary to carry out a scheme to enhance internal quantum efficiency or light extraction efficiency. For example, as described in Japanese Unexamined Patent Application Publication Nos. 2002-182580, 2003-168762 and 2002-118124, typically, a substrate used for crystal growth is removed, or an electrode is not arranged on a light emission surface of an LED.

However, in the case where the above-described transfer technique is used, an adhesive layer used to fix an LED on a glass substrate is adhered to the whole light emission surface of the LED, and efficiency (light extraction efficiency) of extracting light emitted from the LED from a back surface (a light emission surface) of the glass substrate is reduced.

It is desirable to provide a light-emitting device allowed to prevent a decline in light extraction efficiency even in the case where a transfer technique is used, and a display including the light-emitting device.

According to an embodiment, there is provided a light-emitting device including: a semiconductor layer including a first conductive contact layer, a first conductive cladding layer, an active layer, a second conductive cladding layer, a second conductive contact layer and a resin block layer in this order. The light-emitting device further includes a first electrode in contact with the first conductive contact layer; and a second electrode in contact with the second conductive contact layer. In this case, the second conductive contact layer includes a first opening at least in a region facing the first electrode. Moreover, the resin block layer includes a plurality of second openings communicated with the first opening, and the first opening has an air gap.

In the light-emitting device according to the embodiment, in the second conductive contact layer in contact with the second electrode, the first opening is arranged at least in a region facing the first electrode, and the resin block layer including a plurality of second openings communicated with the first opening is arranged outside the second conductive layer. Therefore, when the light-emitting device according to the embodiment is fixed to a supporting substrate with, for example, a resin layer in between, the resin block layer is allowed to prevent the resin layer from being injected into the first opening so that an air gap in the first opening is completely filled with the resin layer.

According to an embodiment, there is provided a display including: a display panel including a plurality of light-emitting devices which are fixed to a supporting substrate with a resin layer in between, and a drive section driving each of the light-emitting devices. Each of the light-emitting devices mounted in the display includes: a semiconductor layer including a first conductive contact layer, a first conductive cladding layer, an active layer, a second conductive cladding layer, a second conductive contact layer and a resin block layer in order of decreasing distance from the supporting substrate. Each of the light-emitting device further includes a first electrode in contact with the first conductive contact layer; and a second electrode in contact with the second conductive contact layer. In this case, the second conductive contact layer includes a first opening at least in a region facing the first electrode. Moreover, the resin block layer includes a plurality of second openings communicated with the first opening, and the first opening has an air gap.

In the display according to the embodiment, in the second conductive contact layer in contact with the second electrode, the first opening is arranged at least in a region facing the first electrode, and the resin block layer including a plurality of second openings communicated with the first opening is arranged outside the second conductive layer. Therefore, when the display according to the embodiment is manufactured, for example, by fixing the light-emitting devices to the supporting substrate with the resin layer in between, the resin block layer is allowed to prevent the resin layer from being injected into the first opening so that an air gap in the first opening is completely filled with the resin layer, and as a result, in the display according to the embodiment, an air gap remains in the first opening.

In the light-emitting device according to the embodiment, when the light-emitting device is fixed to the supporting substrate with the resin layer in between, an air gap is formed in the first opening of the second conductive contact layer in contact with the second electrode. Therefore, a whole light emission surface of the light-emitting device is not adhered to the resin layer, so a decline in light extraction efficiency is preventable.

In the display according to the embodiment, whole light emission surfaces of the light-emitting devices are not adhered to the resin layer. Therefore, a decline in light extraction efficiency is preventable.

Other objects, features and advantages of the embodiments will appear more fully from the following description.

Additional features and advantages are described herein, and will be apparent from the following Detailed Description and the figures.

BRIEF DESCRIPTION OF THE FIGURES

FIGS. 10A and 10B are sectional views for describing an example of steps following FIGS. 9A and 9B.

DETAILED DESCRIPTION

An embodiment will be described in detail below referring to the accompanying drawings. Descriptions will be given in the following order.

Figure 1:
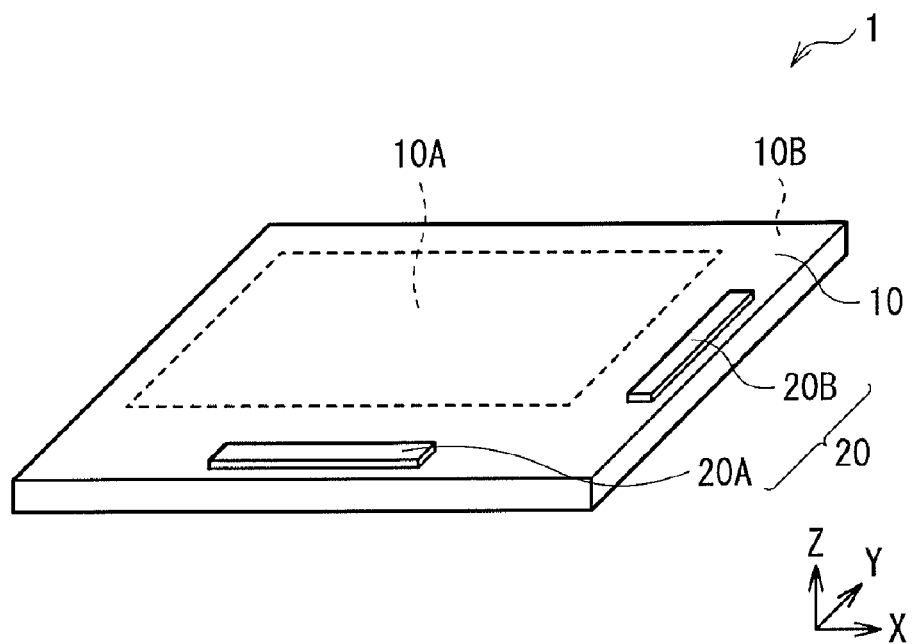
FIG. 1 is a perspective view of a display according to an embodiment.

1. Configurations of display and light-emitting device
2. Method of manufacturing light-emitting device
3. Effects of display Configurations of Display and Light-Emitting Device FIG. 1 illustrates a perspective view of an example of a schematic configuration of a display 1 according to an embodiment. The display 1 according to the embodiment is a so-called LED display, and uses LEDs as display pixels. For example, as illustrated in FIG. 1, the display 1 includes a display panel 10 (a supporting substrate) and a drive IC 20 (a drive section).

Display Panel 10

Figure 2:
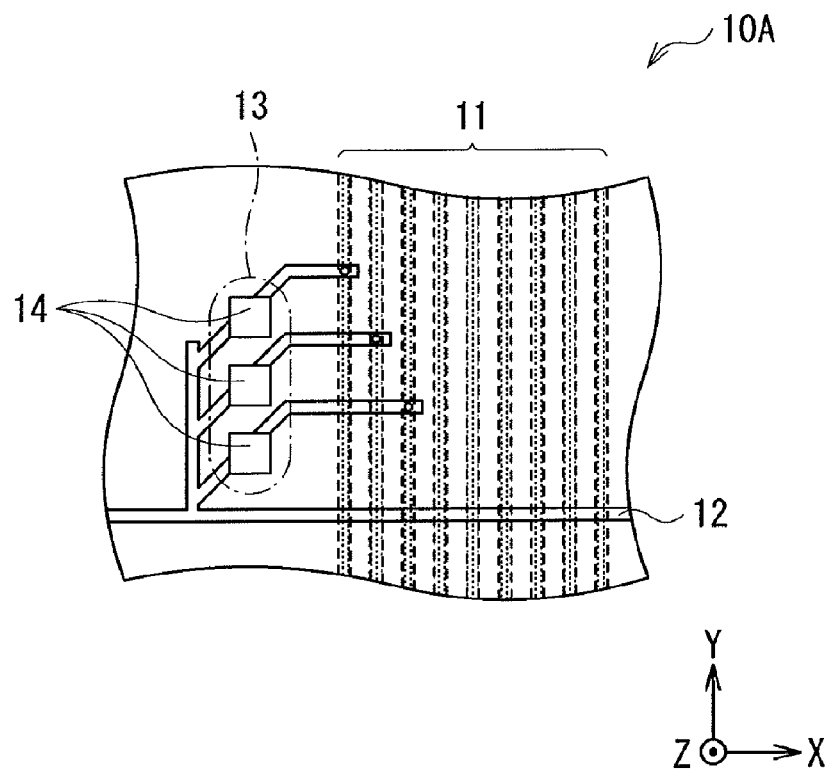
FIG. 2 is a top view of an image display region in FIG. 1.

The display panel 10 includes an image display region 10A and a ring-shaped frame region 10B around the image display region 10A in one surface thereof. In the image display region 10A, for example, as illustrated in FIG. 2, a plurality of data lines 11 are formed so as to extend in a vertical direction (in a vertical direction in the drawing) and to be arranged in parallel with a predetermined pitch. In the image display region 10A, for example, a plurality of scan lines 12 are formed so as to extend in a direction intersecting the data lines 11, more specifically in a horizontal direction (a horizontal direction in the drawing) and to be arranged in parallel with a predetermined pitch.

The data lines 11 and the scan lines 12 intersect each other (orthogonally intersect each other in FIG. 2) in the image display region 10A when viewed from the direction of the normal to the display panel 10. The scan lines 12 are formed in, for example, an outermost layer, and the data lines 11 are formed in a different layer (a layer below the outermost layer) from the outermost layer including the scan lines 12. Display pixels 13 are arranged in intersections of the data lines 11 and the scan lines 12, and a plurality of display pixels 13 are arranged in a grid pattern in the image display region 10A.

Light-Emitting Device 14

For example, one or a plurality of light-emitting devices 14 are mounted in each display pixel 13. FIG. 2 illustrates the case where three light-emitting devices 14 configure one display pixel 13 and one display pixel 13 is allowed to emit light beams of three primary colors RGB. The light-emitting devices 14 are, for example, LEDs.

Figure 3A:
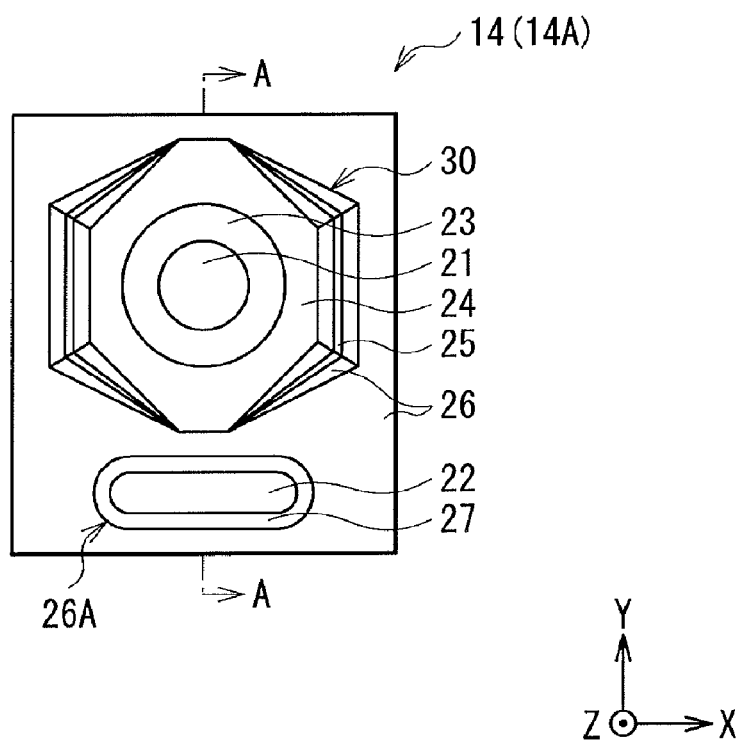
FIGS. 3A and 3B are a top view and a bottom view of a light-emitting device in FIG. 1.

For example, as illustrated in FIG. 3A, in the light-emitting device 14, a pair of electrodes 21 and 22 for injecting a current to the light-emitting device 14 are arranged on a top surface 14A of the light-emitting device 14. The electrode 21 of the two electrodes 21 and 22 arranged on the top surface 14A is electrically connected to the data line 11 through, for example, a bonding wire. Moreover, the electrode 22 of the two electrodes 21 and 22 arranged on the top surface 14A is electrically connected to the scan line 12 through, for example, a bonding wire.

Figure 4:
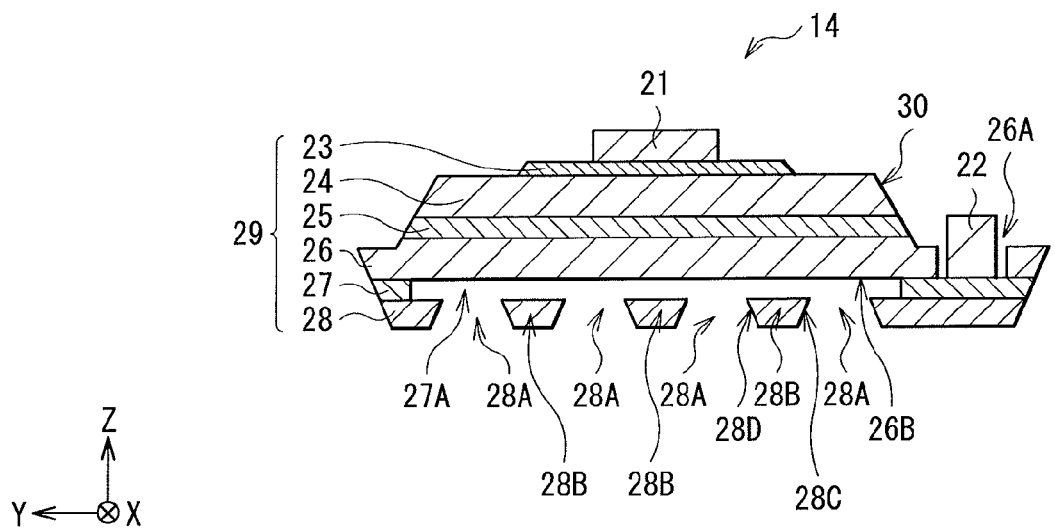
FIG. 4 is a sectional view taken along an arrow direction A-A of the light-emitting device in FIGS. 3A and 3B.

For example, as illustrated in FIG. 4, the light-emitting device 14 further includes a semiconductor layer 29 including a p-type contact layer 23, a p-type cladding layer 24, an active layer 25, an n-type cladding layer 26, an n-type contact layer 27 and a resin block layer 28 in this order from a side close to the electrode 21.

The p-type contact layer 23 is made of, for example, p-type GaAs, and the p-type cladding layer 24 is made of, for example, p-type AlGaInP. The active layer 25 has, for example, a quantum well structure configured by alternately laminating a well layer made of GaInP and a barrier layer made of AlGaInP. If necessary, the active layer 25 may include a pair of guide layers between which the quantum well structure is sandwiched. The guide layers are made of, for example, AlGaInP. The n-type cladding layer 26 is made of, for example, n-type AlGaInP, and the n-type contact layer 27 is made of, for example, n-type GaAs. The resin block layer 28 is made of a material allowed to be subjected to selective wet etching in relation to GaAs, for example, n-type AlGaInP. The p-type cladding layer 24 and the n-type cladding layer 26 have a lower refractive index and a larger band gap than those of the active layer 25. In other words, the semiconductor layer 29 has a double heterostructure, and functions as a light-emitting diode (LED) emitting light of a wavelength corresponding to the band gap of the active layer 25 from the active layer 25 by current injection.

The electrode 21 is formed, for example, by laminating palladium (Pd), platinum (Pt) and gold (Au) in this order on the p-type contact layer 23. On the other hand, the electrode 22 is formed, for example, by laminating an alloy of gold (Au) and germanium (Ge), nickel (Ni) and gold (Au) in this order.

Figure 5:
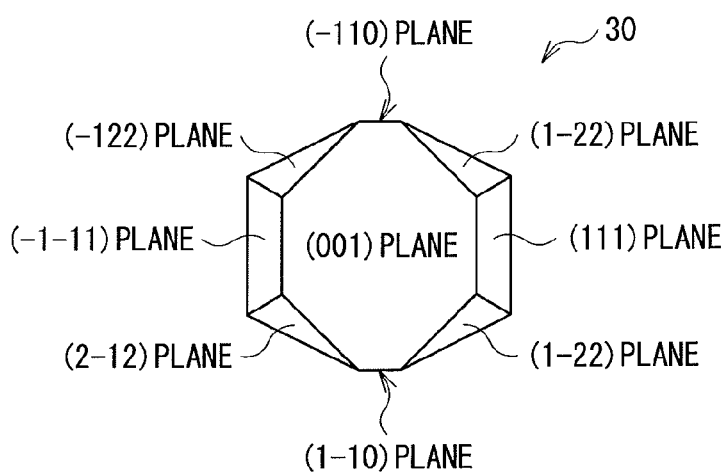
FIG. 5 is a top view illustrating crystal planes of a mesa section in FIGS. 3A and 3B.

An upper part (a part on a side close to the active layer 25) of the n-type cladding layer 26, the active layer 25 and the p-type cladding layer 24 form a columnar mesa section 30 (a projection section) extending in a laminate direction. For example, as illustrated in FIG. 5, the mesa section 30 has the shape of a truncated octagonal pyramid. In other words, the mesa section 30 is an octagonal prism with a top surface and a bottom surface in which the top surface and the bottom surface are parallel to each other and the top surface is smaller than the bottom surface. The top surface of the mesa section 30 is a (001) plane. The bottom surface of the mesa section 30 is a (00-1) plane. A pair of side surfaces extending in a longitudinal direction of the mesa section 30 in eight side surfaces of the mesa section 30 are a (111) plane and a (-1-11) plane. A pair of side surfaces extending in a lateral direction of the mesa section 30 in the eight side surfaces of the mesa section 30 are a (1-10) plane and a (-110) plane. The remaining four side surfaces in the eight side surfaces of the mesa section 30 are (1-22) plane, a (2-12) plane, a (-122) plane and a (1-22) plane.

The n-type cladding layer 26 is exposed on a base of the mesa section 30. An opening 26A is formed in a part exposed to the base of the mesa section 14 of the n-type cladding layer 26. A top surface of the n-type contact layer 27 is exposed to a bottom surface of the opening 26A. The electrode 22 is in contact with the surface exposed to the bottom surface of the opening 26A of the n-type contact layer 27, and the n-type contact layer 27 and the electrode 22 are electrically connected to each other. On the other hand, the electrode 21 is in contact with a top surface of the p-type contact layer 23, and the p-type contact layer 23 and the electrode 21 are electrically connected to each other.

For example, as illustrated in FIG. 4, an opening 27A (a first opening) is arranged in the n-type contact layer 27. The opening 27A is arranged in at least in a region facing the electrode 21. The opening 27A is an air gap, and a bottom surface 26B (a surface on a side close to the n-type contact layer 27) of the n-type cladding layer 26 configures a light emission surface.

Figure 3B:
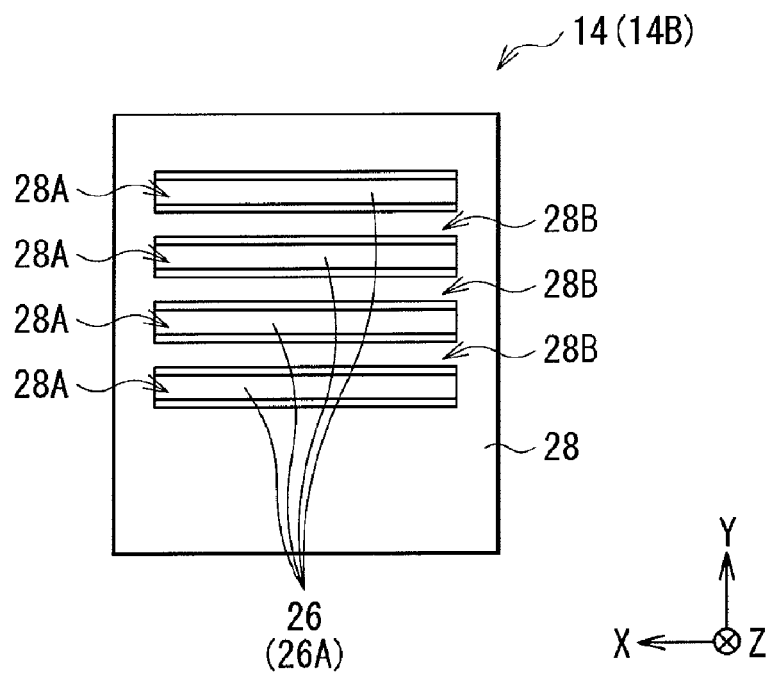

For example, as illustrated in FIGS. 3B and 4, a plurality of openings 28A (second openings) are arranged in the resin block layer 28. Each of the openings 28A is communicated with the opening 27A, and is an air gap. For example, each of the openings 28A extends in a direction (a first direction) perpendicular to a (110) plane, and has a rectangular shape. Moreover, as illustrated in FIGS. 3B and 4, a part between adjacent openings 28A of the resin block layer 28 is a rod-shaped beam section 28B extending in the direction perpendicular to the (110) plane. For example, as illustrated in FIG. 4, each beam section 28B has inclined surfaces 28C and 28D formed of a (111) plane and a (-1-11) plane as side surfaces.

The depth of each opening 28A, that is, the thickness of the resin block layer 28 is larger than the thickness of the n-type contact layer 27 (for example, tens of nm). Moreover, the width of each opening 28A (the width of a narrowest part) is equal to or smaller than the width of each beam section 28B (the width of a widest part).

Figure 6:
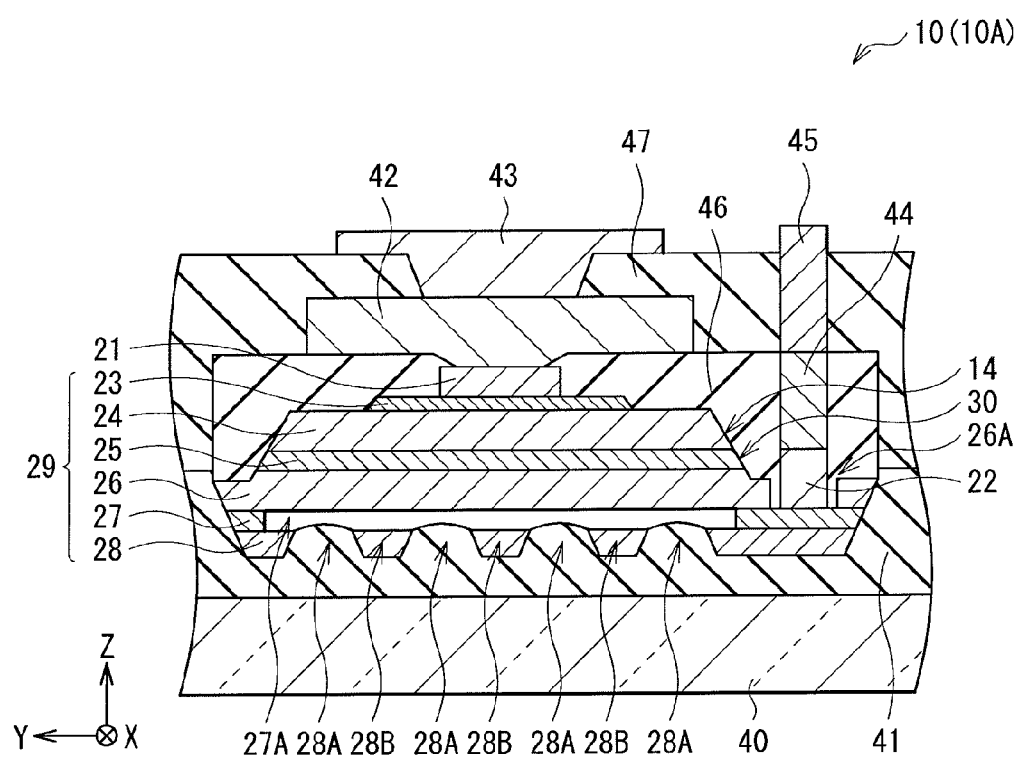
FIG. 6 is a sectional view of the light-emitting device in the display in FIG. 1.

FIG. 6 illustrates an example of a sectional configuration of a part including the light-emitting device 14 when the light-emitting device 14 is mounted in the image display region 10A of the display panel 10. For example, as illustrated in FIG. 6, the light-emitting device 14 is fixed on a supporting substrate 40 with a resin layer 41 in between. The resin block layer 28 which is a layer closest to the supporting substrate 40 in the semiconductor layer 29 is in contact with the resin layer 41, and each of the openings 28A arranged in the resin block layer 28 is filled with the resin layer 41. However, the resin layer 41 is slightly charged into the opening 27A arranged in the n-type contact layer 27; therefore, the opening 27A has an air gap. In other words, a surface exposed to the inside of the opening 27A of the n-type cladding layer 26 is in contact with air with a refractive index of 1, and is not in contact with the resin layer 41.

The electrode 21 of the light-emitting device 14 is electrically connected to an extraction electrode 43 exposed on a top surface of the image display region 10A through a bump 42 arranged in the image display region 10A. On the other hand, the electrode 22 of the light-emitting device 14 is electrically connected to an extraction electrode 45 exposed on the top surface of the image display region 10A through a bump 44 arranged in the image display region 10A. The light-emitting device 14, the bumps 42 and 44 and parts of the extraction electrodes 43 and 45 are covered with the resin layers 46 and 47.

In this case, the bumps 42 and 44 and the extraction electrodes 43 and 45 are made of, for example, metal including Au, Al, Cr, Ti, Ag or Cu as a main component. The resin layer 46 is made of, for example, an epoxy adhesive, and the resin layer 47 is made of, for example, a CRC polyimide-based material.

Method of Manufacturing Light-Emitting Device 14

Next, an example of a method of manufacturing the light-emitting device 14 according to the embodiment will be described below. FIGS. 7A and 7B to 10A and 10B are sectional views illustrating an example of steps of manufacturing the light-emitting device 14 in order.

Figure 7A:
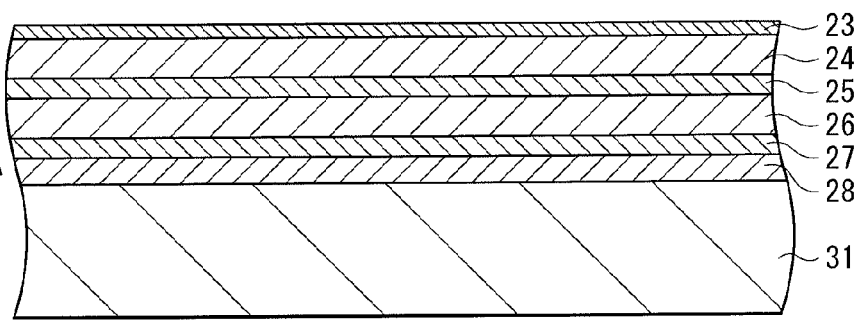
FIGS. 7A and 7B are sectional views for describing an example of a method of manufacturing the light-emitting device in FIG. 4.

First, a substrate 31 which is a growth substrate for forming the semiconductor layer 29 by crystal growth is prepared, and then, for example, the resin block layer 28, the n-type contact layer 27, the n-type cladding layer 26, the active layer 25, the p-type cladding layer 24 and the p-type contact layer 23 are formed in this order on the substrate 31 (refer to FIG. 7A). Next, a mask with a predetermined shape (not illustrated) is formed on the p-type contact layer 23, and then the p-type contact layer 23 is selectively removed with use of a phosphoric acid mixture (phosphoric acid 6:hydrogen peroxide water 2:water 100). After that, the mask is removed.

Next, a rectangular mask (not illustrated) is formed on a surface of the p-type cladding layer 24 including the p-type contact layer 23 so that the longitudinal direction of the mask is perpendicular to a [110] direction, and then parts of the p-type cladding layer 24, the active layer 25, the n-type cladding layer 26 and the n-type contact layer 27 are selectively removed with use of an etching solution formed by cooling hydrochloric acid to −15° C. Thus, the mesa section 30 is formed (refer to FIG. 7B). Such an etching process may be completed by performing etching a plurality of times.

At this time, the rate of etching the (111) plane and the (−1-11) plane is approximately one hundredth of the rate of etching the (1-10) plane and the (−110) plane. Therefore, in the above-described etching process, the (111) plane and the (−1-11) plane are exposed on a long side of the mask extending in a direction perpendicular to a [110] direction to reduce the etching rate. Therefore, when the above-described etching process is completed, a pair of side surfaces extending in the longitudinal direction of the mesa section 30 form the (111) plane and the (−1-11) plane. On the other hand, in the above-described etching process, the (111) plane and the (−1-11) plane are not exposed as etching planes on a short side of the mask extending in a direction parallel to the [110] direction. Therefore, the reaction of etching on the (110) plane proceeds, and etching proceeds to a short side region of the mask without reducing the etching rate to form the (1-10) plane and the (−110) plane (a vertical plane). At this time, side etching occurs at corners of the mask to form the (1-22) plane, the (2-12) plane, the (−122) plane and the (1-22) plane. Thus, the mesa section 30 having crystal planes illustrated in FIG. 5 is formed.

Figure 7B:
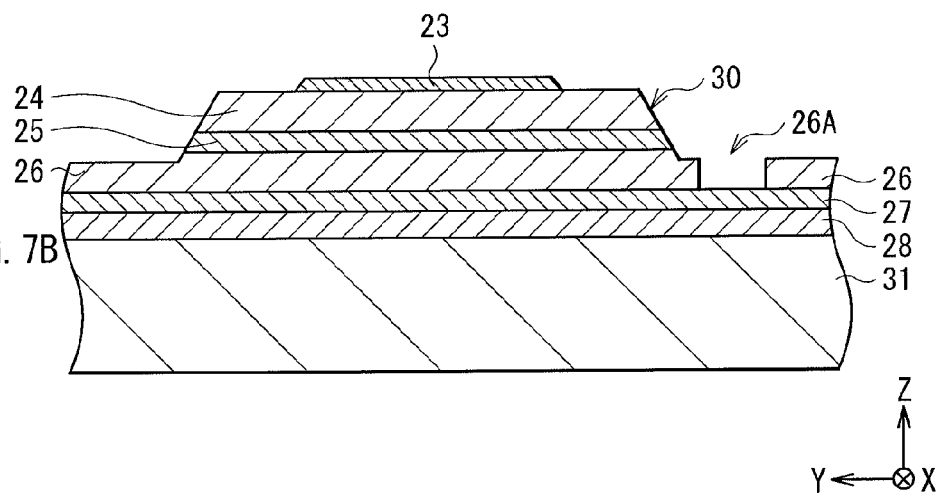
Figure 8A:
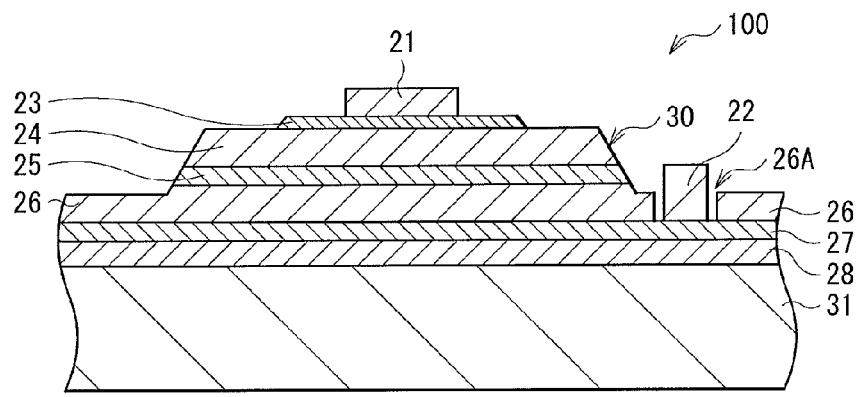
FIGS. 8A and 8B are sectional views for describing an example of steps following FIGS. 7A and 7B.
Figure 8B:
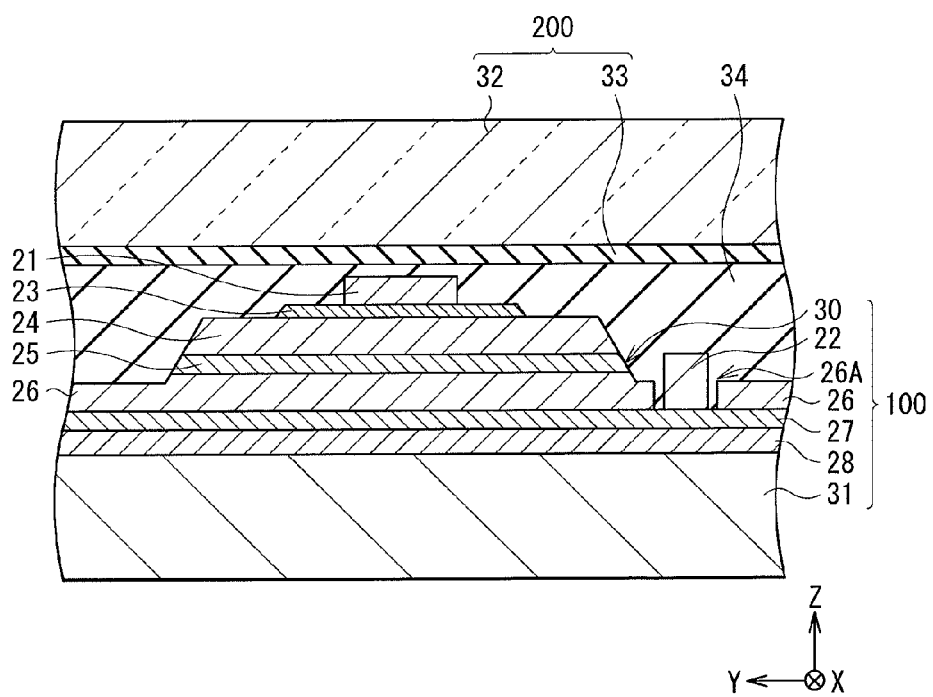
Figure 9A:
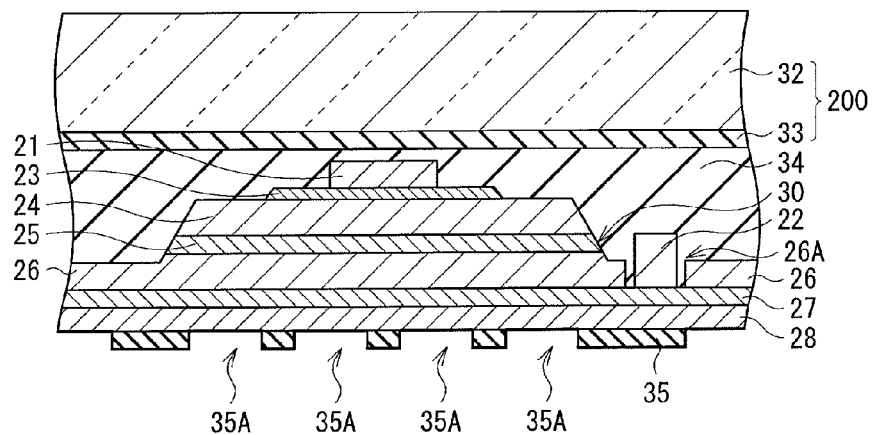
FIGS. 9A and 9B are sectional views for describing an example of steps following FIGS. 8A and 8B.
Figure 9B:
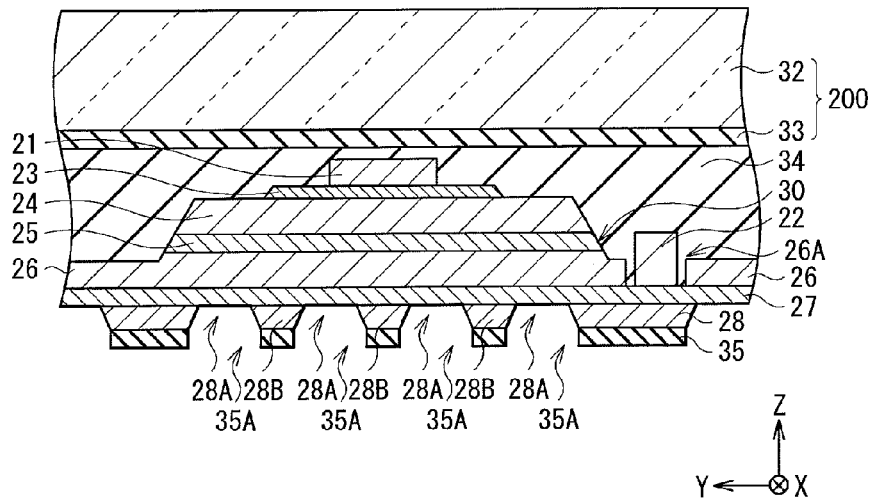

Next, the mask is removed, and then the opening 26A is formed in a part of the base of the mesa section 30 of the n-type cladding layer 26 to expose the n-type contact layer 27 on the bottom surface of the opening 26A (refer to FIG. 7B). Next, the electrode 21 is formed on the top surface of the p-type contact layer 23 by, for example, evaporation, and the electrode 22 is formed on a surface of the n-type contact layer 27 exposed on the bottom surface of the opening 26A by, for example, evaporation (refer to FIG. 8A). Thus, a wafer 100 is formed.

Next, for example, a light coating of a CRC polyimide-based material allowed to be separated by laser ablation is applied to the supporting substrate 32 and is cured to form a wafer 200 having a release layer 33 on the supporting substrate 32. Next, the wafer 200 is bonded to a surface including the mesa section 30 of the wafer 100 with an epoxy-based adhesive 34 in between so that the release layer 33 faces the mesa section 30 (refer to FIG. 8B). At this time, the wafer 100 and wafer 200 are bonded together in a low vacuum so as to prevent the entry of air bubbles into the adhesive 34, and the adhesive 34 is thermally cured while the adhesive 34 is subjected to weight bearing.

Next, in the wafer 100 and the wafer 200 bonded together, the substrate 31 is removed. More specifically, the substrate 31 is lapped until a predetermined thickness, and then the remaining substrate 31 is completely removed with a solution including an ammonia-hydrogen peroxide water to expose the resin block layer 28. Next, a resist mask 35 having a plurality of striped openings 35A is formed on a surface of the exposed resin block layer 28 (refer to FIG. 9A). Each of the openings 35A is arranged corresponding to a part where the beam section 28 is formed, and extends in a direction perpendicular to the [110] direction.

Then, the resin block layer 28 is selectively removed with use of, for example, an etching solution formed by cooling hydrochloric acid to −15° C. Therefore, the openings 28A and the beam sections 28B are formed in the resin block layer 28, and the n-type contact layer 27 is exposed on the bottom surfaces of the openings 28A.

At this time, as in the case where the mesa section 30 is formed, the rate of etching the (111) plane and the (−1-11) plane is approximately one hundredth of the rate of etching the (1-10) plane and the (−110) plane. Therefore, in the above-described etching process, the (111) plane and the (−1-11) plane are exposed on the long sides of opening 35A extending in a direction perpendicular to the [110] direction to reduce the etching rate. Therefore, when the above-described etching process is completed, a pair of side surfaces 28C and 28D extending in the longitudinal direction of the beam section 28B form the (111) plane and the (−1-11) plane. On the other hand, in the above-described etching process, the (111) plane and the (−1-11) plane are not exposed as etching planes on the short sides of the opening 35A. Therefore, the reaction of etching on the (110) plane proceeds, and etching proceeds to a short side region of the opening 35A without reducing the etching rate to form the (1-10) plane and the (−110) plane (the vertical plane). Thus, the beam section 28B having the (111) plane and the (−1-11) plane as the side surfaces 28C and 28D is formed.

Next, a surface of the n-type contact layer 27 exposed on the bottom surfaces of the openings 28A is immersed in a phosphoric acid solution for a predetermined time to selectively remove not only parts corresponding to the bottom surfaces of the openings 28A of the n-type contact layer 27 but also parts corresponding to the beam sections 28B of the n-type contact layer 27. Therefore, the opening 27A communicated with each of the openings 28A is formed at least in a region facing the electrode 21 of the n-type contact layer 27 (refer to FIG. 10A). At this time, both of the opening 27A and each of the openings 28A are air gaps, and the beam sections 28B are located in midair. Thus, a plurality of light-emitting devices 14 are formed on the wafer 200.

Next, the resist mask 35 is removed, and then the resin block layer 28, the n-type contact layer 27 and the adhesive 34 are selectively removed by, for example, RIE (Reactive Ion Etching) to expose the release layer 33 (refer to FIG. 10B). Therefore, the light-emitting devices 14 formed on the wafer 200 are separated from one another to form chips. Thus, the light-emitting device 14 according to the embodiment is formed.

After that, the respective light-emitting devices 14 on the wafer 200 are adhered to the resin layer 41 applied to the supporting substrate 40, and laser light is applied to the release layer 33 to ablate the release layer 33. Thus, the respective light-emitting devices 14 are allowed to be transferred to the supporting substrate 40. In doing so, each of the light-emitting devices 14 is allowed to be mounted on the display pixel 13.

Effects of Display 1

In the embodiment, in the n-type contact layer 27 in contact with the electrode 22, the opening 27A is arranged at least in the region facing the electrode 21, and the resin block layer 28 including a plurality of openings 28A communicated with the opening 27A is arranged outside the n-type contact layer 27 (on a light emission side). In this case, the depth of each opening 28A, that is, the thickness of the resin block layer 28 is larger than the thickness of the n-type contact layer 27 (for example, by tens of nm). Therefore, for example, in a manufacturing process, when the light-emitting devices 14 are fixed to the supporting substrate 40 with the resin layer 41 in between to manufacture the display 1, the resin block layer 28 is allowed to effectively prevent the resin layer 41 from being injected into the opening 27A so that an air gap in the opening 27A is completely filled with the resin layer 41. As a result, an air gap remains in the opening 27A in the display 1. Therefore, in the embodiment, whole light emission surfaces (the bottom surface 26B of the n-type cladding layer 26) of the light-emitting devices 14 are not adhered to the resin layer 41, so a decline in light extraction efficiency is allowed to be prevented.

Moreover, in the embodiment, the thickness of the n-type contact layer 27 is extremely thin, for example, approximately tens of nm, and the volume of air contained in the opening 27A formed in the n-type contact layer 27 is extremely small. Therefore, for example, in the process of manufacturing the display 1, in the case where the light-emitting devices 14 are transferred to the supporting substrate 40 and then heat is applied to air in the opening 27A, the possibility that the light-emitting devices 14 are separated from the substrate 40 by expansion of air is allowed to be eliminated.

The above-described embodiment is applied to wires (data lines 11) extending in the vertical direction and a drive IC driving the wires is described. However, the embodiment is applicable to wires (scan lines 12) extending in a horizontal direction and a drive IC driving the wires.

Moreover, the above-described embodiment is applied to an LED display. However, the embodiments are applicable to any other displays. Further, the above-described embodiment is applied to a simple matrix drive display, but the embodiment is applicable to an active matrix drive display.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-emitting device comprising:
   a semiconductor layer including a first conductive contact layer, a first conductive cladding layer, an active layer, a second conductive cladding layer, a second conductive contact layer and a resin block layer arranged in this order;
   a first electrode in contact with the first conductive contact layer; and
   a second electrode in contact with the second conductive contact layer,
   wherein the second conductive contact layer includes a first opening at least in a region facing the first electrode,
   wherein the resin block layer includes a plurality of second openings communicating with the first opening, and
   wherein the first opening has an air gap.

2. The light-emitting device according to claim 1, wherein each of the second openings extends in a first direction, and a part between adjacent second openings of the resin block layer is a rod-shaped beam section extending in the first direction.

3. The light-emitting device according to claim 2, wherein the beam section has an inclined surface as a side surface, the inclined surface extending in a direction perpendicular to a (110) plane and being formed by a (111) plane.

4. The light-emitting device according to claim 1, wherein a thickness of the resin block layer is larger than a thickness of the second conductive contact layer.

5. The light-emitting device according to claim 1, wherein the second conductive contact layer has an exposed surface not in contact with the second conductive cladding layer on a surface on a side close to the second conductive cladding layer, and
   the second electrode is in contact with the exposed surface.

6. A display comprising:
   a display panel including a plurality of light-emitting devices which are fixed to a supporting substrate with a resin layer in between; and
   a drive section driving each of the light-emitting devices, each of the light-emitting devices including:
      a semiconductor layer including a first conductive contact layer, a first conductive cladding layer, an active layer, a second conductive cladding layer, a second conductive contact layer and a resin block layer in order of decreasing distance from the supporting substrate,
      a first electrode in contact with the first conductive contact layer, and
      a second electrode in contact with the second conductive contact layer,
   wherein the second conductive contact layer includes a first opening at least in a region facing the first electrode,
   the resin block layer includes a plurality of second openings communicated with the first opening, and
   the first opening has an air gap.

* * * * *